: US 6,518,110 B2

(12) United States Patent
Wen (10) Patent No.: US 6,518,110 B2
(45) Date of Patent: Feb. 11, 2003

(54) METHOD OF FABRICATING MEMORY CELL STRUCTURE OF FLASH MEMORY HAVING ANNULAR FLOATING GATE

(76) Inventor: Wen Ying Wen, No. 19, Alley 28, Lane 205, Yuan Hsan Rd., Chu-Tung Town, Hsinchu Hsien (TW)

( * ) Notice: Subject to any disclaimer, the term of this patent is extended or adjusted under 35 U.S.C. 154(b) by 0 days.

(21) Appl. No.: 09/758,310

(22) Filed: Jan. 12, 2001

(65) Prior Publication Data

US 2002/0048882 A1 Apr. 25, 2002

Related U.S. Application Data

(62) Division of application No. 09/653,316, filed on Sep. 1, 2000.

(51) Int. Cl.$^7$ .......................................... H01L 21/8238
(52) U.S. Cl. ........................ 438/201; 438/211; 438/257; 438/261; 438/265
(58) Field of Search ................................ 438/201, 211, 438/257, 261, 265, 667

(56) References Cited

U.S. PATENT DOCUMENTS

| | | | | |
|---|---|---|---|---|
| 4,608,585 A | * | 8/1986 | Keshtbod ..................... | 257/321 |
| 5,461,249 A | * | 10/1995 | Ozawa ........................ | 257/321 |
| 5,563,077 A | * | 10/1996 | Ha ............................. | 438/156 |
| 5,776,787 A | * | 7/1998 | Keshtbod ..................... | 438/257 |
| 5,789,297 A | * | 8/1998 | Wang et al. ................. | 438/267 |
| 6,010,934 A | * | 1/2000 | Wu ............................ | 438/264 |
| 6,054,345 A | * | 4/2000 | Alsmeier et al. ........... | 438/238 |
| 6,091,102 A | * | 7/2000 | Sekariapuram et al. ..... | 257/316 |
| 6,107,141 A | * | 8/2000 | Hsu et al. ................... | 438/267 |
| 6,174,772 B1 | * | 1/2001 | Hsieh et al. ................ | 257/321 |
| 6,284,596 B1 | * | 9/2001 | Sung et al. ................. | 438/257 |

FOREIGN PATENT DOCUMENTS

JP        3144573     * 6/1988    ........ 438/FOR 168

* cited by examiner

*Primary Examiner*—Eddie Lee
*Assistant Examiner*—Paul E Brock, II
(74) *Attorney, Agent, or Firm*—Rosenberg, Klein & Lee (57) ABSTRACT

The present invention relates to a memory cell structure of a flash memory and a method for fabricating the same and, more particularly, to a flash memory having annular floating gates. The present invention uses the capacitance coupling between the source and the floating gate to form a channel in the substrate under the floating gate. Hot electrons are injected into the floating gate or released from the floating gate to the control gate through inerpoly dieletric by injection point on the top of floating gate In the proposed memory cell, a floating gate is etched to form an annular shape situated between a drain, a source, and two field oxides. An interpoly dielectric and a control gate are stacked in turn on the floating gate and on the surface of the substrate not covered by the floating gate through means of self-alignment. An injection point not covered by the SiN film of the interpoly dielectric is formed on the top of the floating gate. Thereby the present invention can not only achieve self-alignment to form the control gate and apply to high-integration memory cells with small areas, but also can release electrons from the floating gate to the control gate by the FN tunneling effect to effectively increase efficiency of erasing data and reliability of devices.

6 Claims, 7 Drawing Sheets

METHOD OF FABRICATING MEMORY CELL STRUCTURE OF FLASH MEMORY HAVING ANNULAR FLOATING GATE

This application is a divisional of copending application (s) application No. 09/653,316 filed on Sep. 1, 2000.

FIELD OF THE INVENTION

The present invention relates to a memory cell structure of a flash memory and a method for fabricating the same and, more particularly, to a flash memory having annular floating gates. The present invention uses the capacitance coupling between the source and the floating gate to form a channel in the substrate under the floating gate. Hot electrons are injected into the floating gate or released from the floating gate to the control gate through inerpoly dieletric by injection point on the top of floating gate.

BACKGROUND OF THE INVENTION

Flash memories have been widely used in electronic products such as portable computers or communication apparatuses because of their non-volatile functions of electrically writing and erasing. Flash memories can generally be categorized into two types according to the shape of their gates: the stacked gate type and the split gate type.

Figure 1:
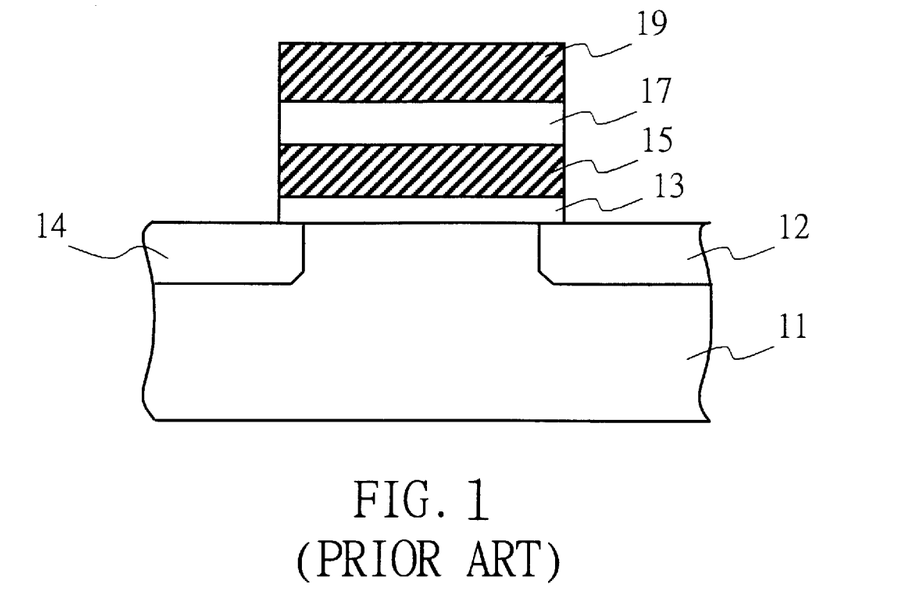
FIG. 1 is a cross-sectional view of a memory cell of a flash memory of stacked gate type in prior art.

FIG. 1 shows a cross-sectional view of a memory cell of a flash memory of stacked gate type in prior art. As shown in the figure, a stacked gate is formed on a semiconductor substrate 11. The stacked gate comprises from bottom to top a gate oxide 13, a floating gate 15, an interpoly dielectric 17, and a control gate 19. A drain region 12 and a source region 14 are formed in the substrate 11 respectively at one side of the stacked gate by ion implantation. Through applied voltage between the control gate 19 and the drain 12 and the source 14, a channel and hot electrons can be formed in the substrate 11 under the floating gate 15. These hot electrons are injected from the drain 12 through the gate oxide 13 into the floating gate 15 by means of hot electron injection so as to complete a program process of writing data. Contrarily, electrons are released from the floating gate 15 to the source 14 by means of the Fowler-Nordheim (FN) tunneling effect for erasing data.

However, for a flash memory of stacked gate type, it is difficult to control the number of electrons released from the floating gate 15 during the data-erasing procedure. Over erase may easily arise, deteriorating the quality and reliability of the flash memory.

Figure 2:
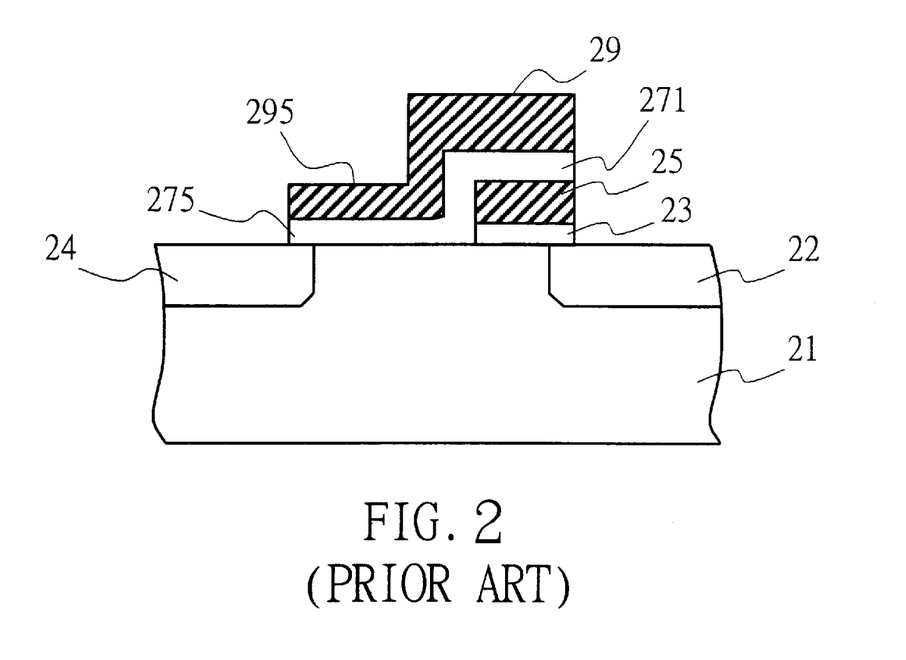
FIG. 2 is a cross-sectional view of a memory cell of a flash memory of split gate type in prior art.

Therefore, flash memories of split gate type have been developed. As shown in FIG. 2, a thinner oxide (such as a tunneling oxide) 23, a floating gate 25, a dielectric film 271, and a control gate 29 are successively deposited on a semiconductor substrate 21. Next, a source region 22 and a drain region 24 are formed at proper positions in the substrate 21 by ion implantation. One end of the control gate 29 has a selecting gate part 295 extending to the drain 24. A selecting gate oxide 275 is disposed between the selecting gate part 295 of the control gate 29 and the drain 24.

Flash memories of split gate type can effectively solve the problem of over erase occurring easily in flash memories of stacked gate type. However, the length of the selecting gate part 295 has a certain limit. Leakage current will be generated if its length is reduced. Moreover, it is difficult to align the relative positions of the source 22, the drain 24, the control gate 29, and the floating gate. The lengths of the selecting gate part 295 and the floating gate 25 thus can not be effectively reduced. Additionally, to enhance the efficiencies of writing and erasing data, larger memory cell size is needed to achieve high capacitance coupling ratio. Therefore, the area of memory cell thereof will be large so that integration density of memory cell can not be effectively increased.

Additionally, although a thinner tunneling oxide can enhance the tunneling effect of electrons, it is very difficult to fabricate a thin oxide having high tunneling effect of electrons in low-power non-volatile memory devices. Moreover, leakage current resulted from increased defect density and stress defects may easily arise to deteriorate the reliability of devices.

SUMMARY AND OBJECTS OF THE PRESENT INVENTION

The primary object of the present invention is to provide a flash memory structure and a method for fabricating the same. In the proposed flash memory, an annular floating gate situated between the drain and the source is exploited. An interpoly dielectric and a control gate are stacked on the surface of the floating gate and on the gate oxide exposed at the center of the floating gate by means of self-alignment. Thereby above mentioned problem can be overcome, and reliability of devices can be enhanced.

Another object of the present invention is to provide a flash memory structure and a method for fabricating the same. In the proposed flash memory, an interpoly dielectric and a control gate circumvent the periphery of the floating gate to enhance the capacitance coupling ratio between the control gate, the floating gate, and the source. Memory cells of the flash memory having efficient program process of writing or erase process can thus be obtained.

Yet another object of the present invention is to provide a flash memory structure and a method for fabricating the same. In the proposed flash memory, the interpoly dielectric circumventing the floating gate is an oxide/nitride/oxide (ONO) structure or an oxide/nitride (ON) structure. The quality and thickness of the interpoly dielectric can be exactly controlled. Flash memory cells of high capacitance coupling ratio and low leakage current can thus be produced.

Yet another object of the present invention is to provide a flash memory structure and a method for fabricating the same. In the proposed flash memory, the floating gate and the source and the drain are electrically insulated by a thicker oxide to reduce accuracy requirement of the fabrication process and to enhance reliability of devices.

Yet another object of the present invention is to provide a flash memory structure and a method for fabricating the same. The proposed fabrication method is compatible to the general fabrication process of CMOS devices, thus simplifying the fabrication process.

Still yet another object of the present invention is to provide a flash memory structure and a method for fabricating the same. In the proposed flash memory, an injection point not covered by a silicon nitride (SiN) film is formed on the top of the floating gate to displace the electrons in the floating gate to the passage of the control gate.

To accomplish above objects, the present invention proposes a memory cell structure of a flash memory. The proposed memory cell structure comprises mainly a semiconductor substrate, an annular floating gate, a first oxide film, a SiN film and a control gate. A source and a drain are formed in the substrate. Part region of the floating gate covers on the surfaces of the source and the drain. A gate oxide electrically insulates the floating gate and the source and the drain. The substrate exposes at the center of the floating gate. The first oxide film covers on the surface of the floating gate and the surface of the substrate exposed at the center and the periphery of the floating gate. The SiN film is situated on the surface of the first oxide adjacent to the floating gate. An injection point not covered by the SiN film is disposed on the top of the floating gate. The control gate covers on the surface of a second oxide.

The present invention also provides a method for fabricating a memory cell structure of a flash memory. The proposed fabrication method comprises the following steps: providing a semiconductor substrate; forming a pad oxide and a SiN on the surface of the substrate; forming a plurality of field oxides in the substrate by the photolithography, etching, and oxidation techniques; etching out the patterns of the pad oxide and the SiN to reserve only the part of the SiN situated between two field oxides by the photolithography and etching techniques; forming a gate oxide on the uncovered surface of the substrate; forming a first poly-silicon on the surface of the SiN and the gate oxide; etching out the pattern of the first poly-silicon by anisotropic dry etching techniques to form an annular floating gate circumventing the SiN; removing the SiN and the pad oxide; forming a first oxide film on surface of the floating gate and the exposed surface of the gate oxide; forming a SiN film on the surface of the first oxide film and etching out the pattern of the SiN film and forming an injection point not covered by the SiN film on the top of the floating gate; forming a second poly-silicon on the surfaces of the SiN film and the first oxide film adjacent to the top of the injection point; etching out the pattern of the second poly-silicon to form a control gate; forming a source and a drain in the substrate by ion implantation; and completing subsequent process of forming metal contact windows.

The various objects and advantages of the present invention will be more readily understood from the following detailed description when read in conjunction with the appended drawings, in which:

DETAILED DESCRIPTION OF PREFERRED EMBODIMENT

Figure 3A:
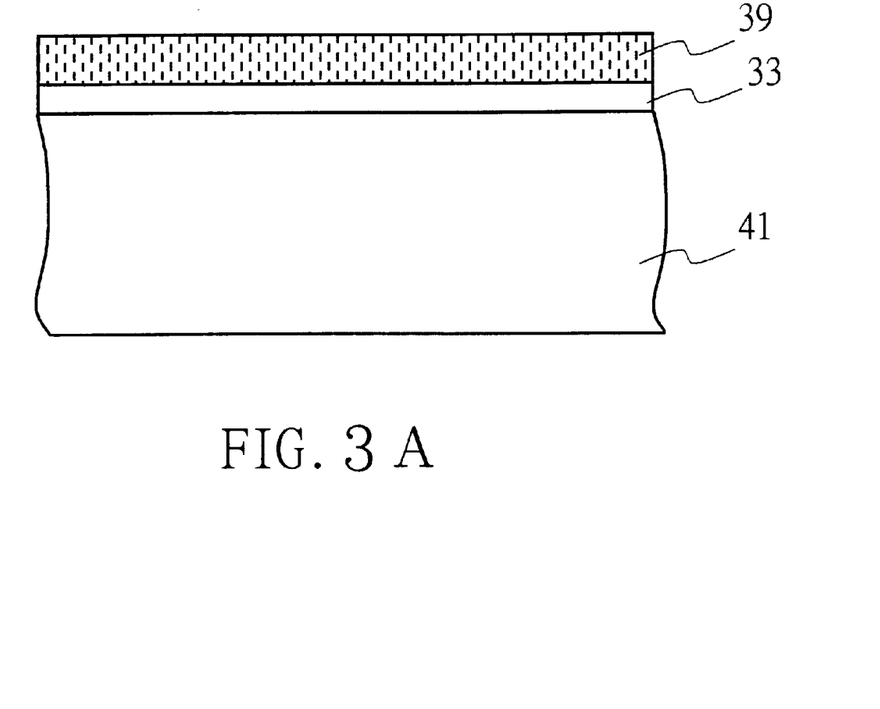
FIGS. 3A to 3H show the fabrication flowchart of a memory cell of a flash memory according to a preferred embodiment of the present invention.
Figure 3B:
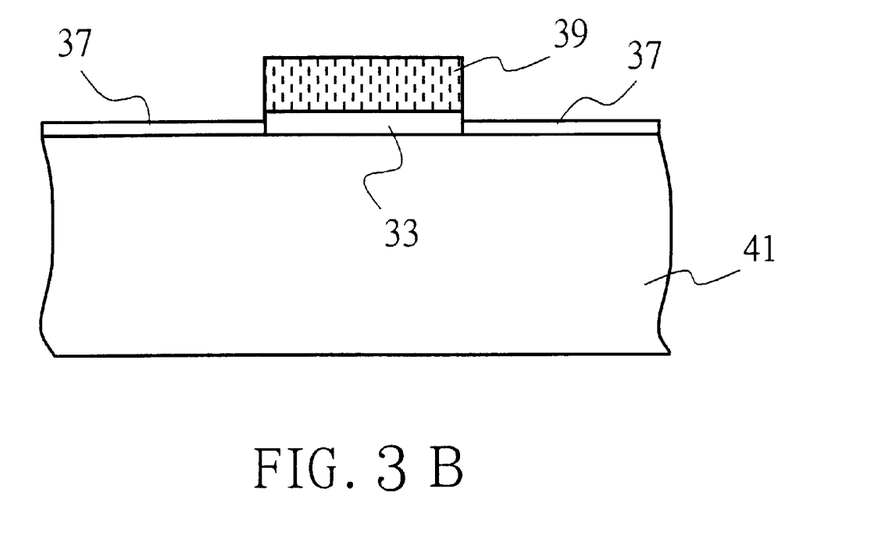
Figure 3C:
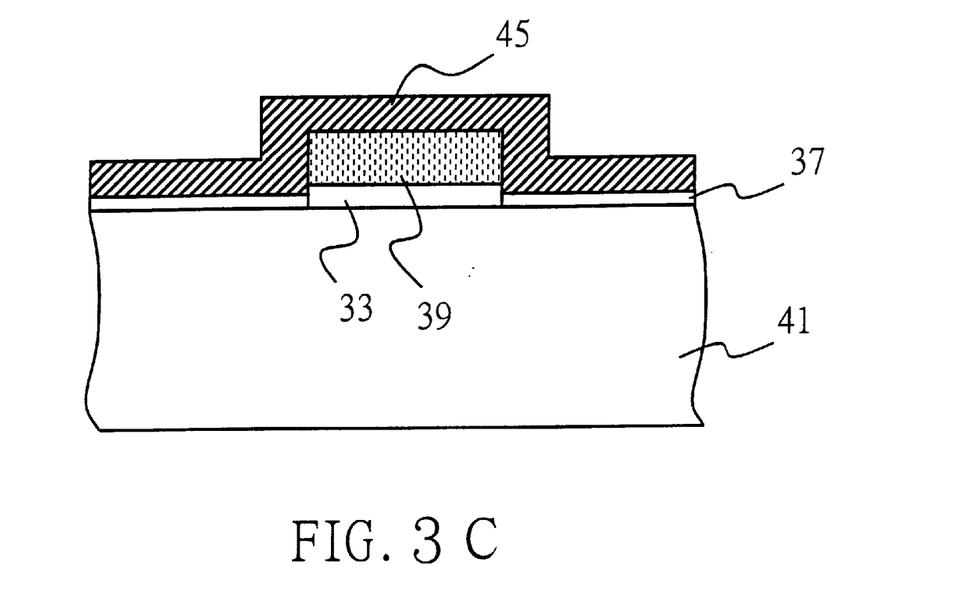
Figure 3D:
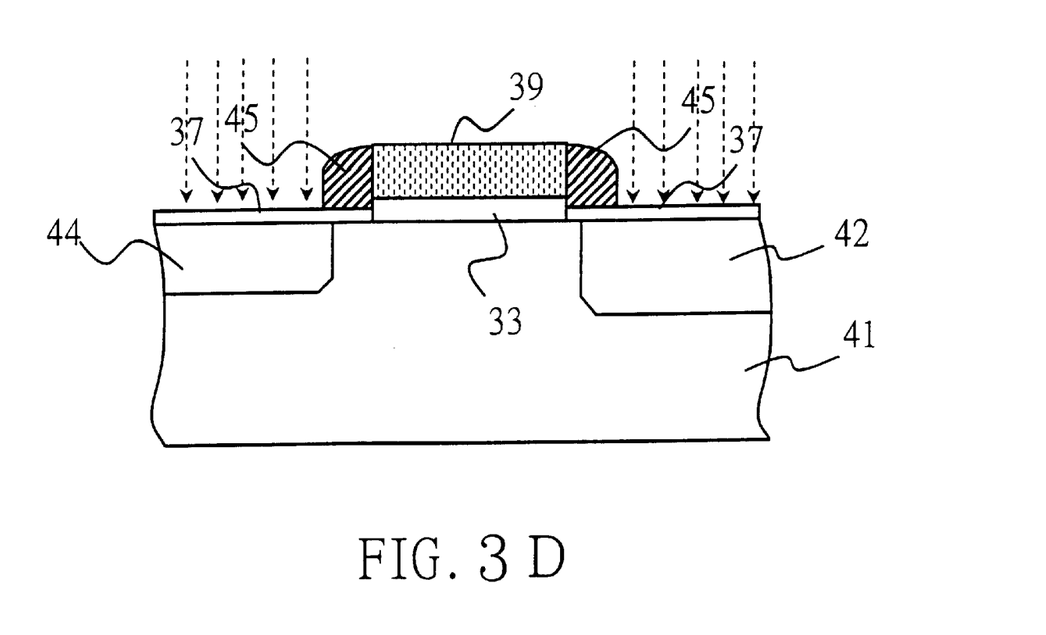
Figure 3E:
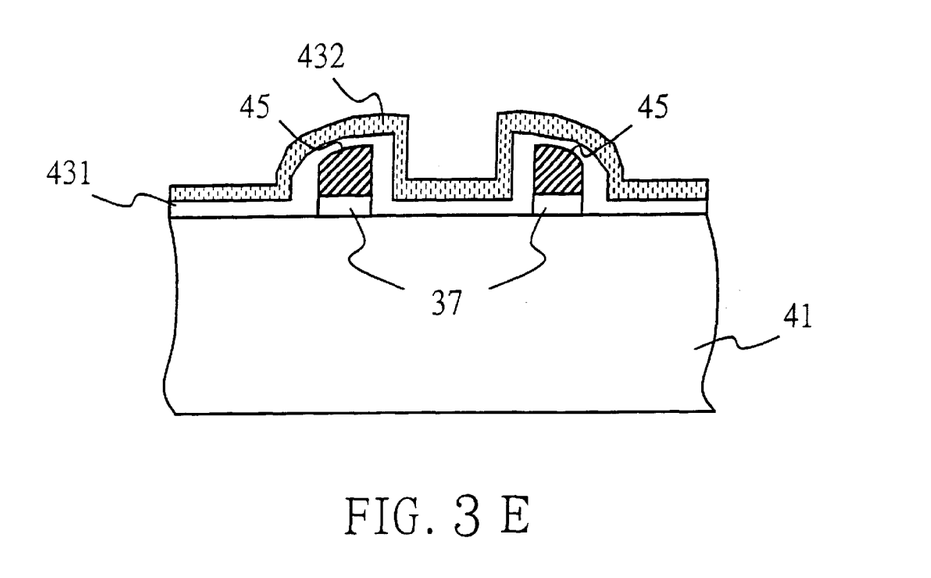
Figure 3F:
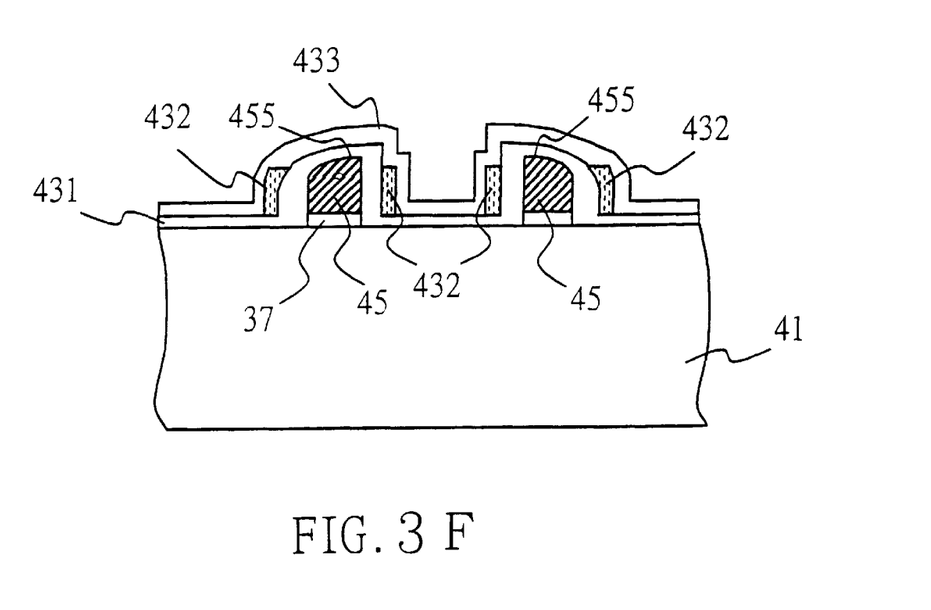
Figure 3G:
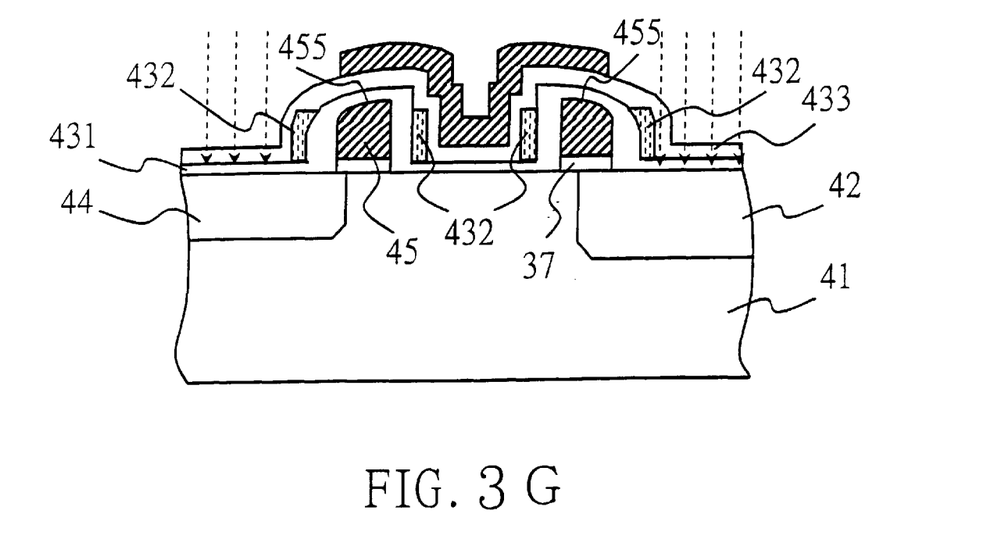
Figure 3H:
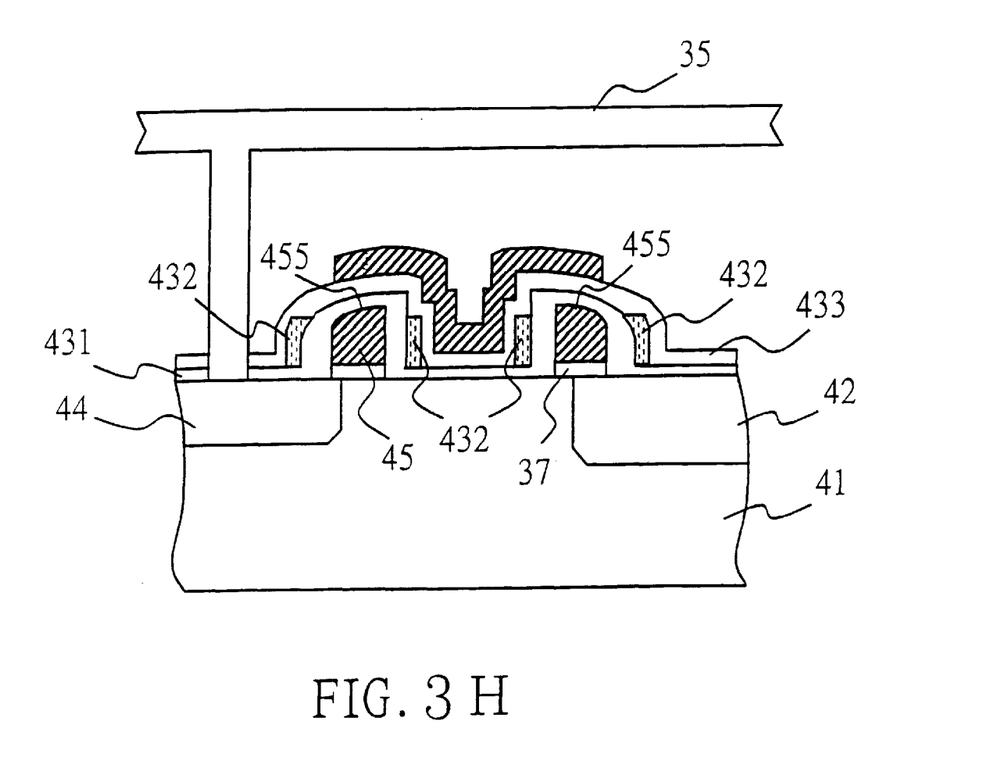
Figure 4A:
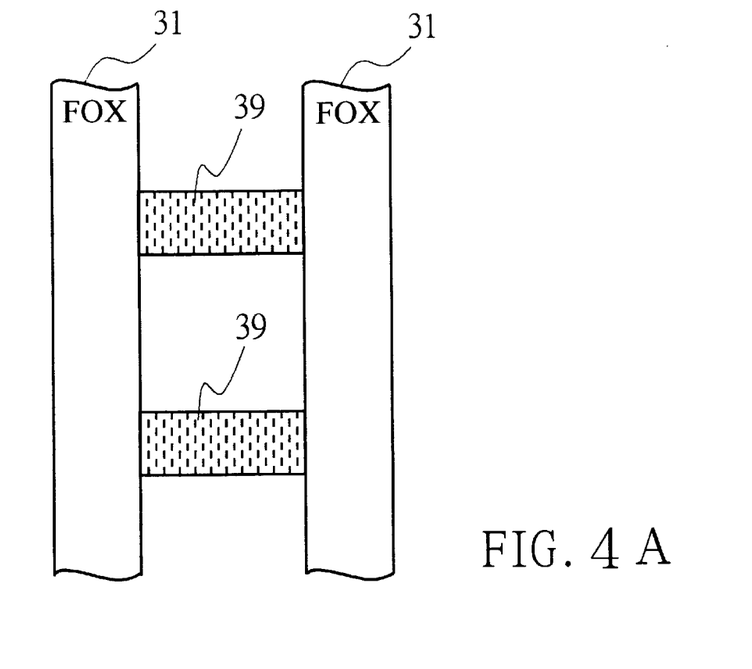
FIGS. 4A to 4C are diagrams of the array structure of a flash memory in part of the fabrication procedures shown in FIG. 3.
Figure 4B:
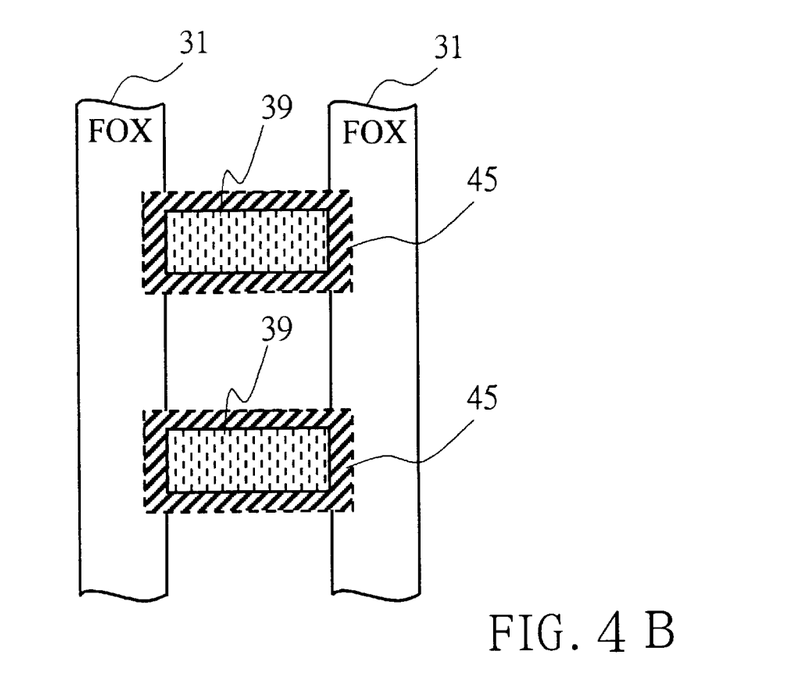
Figure 4C:
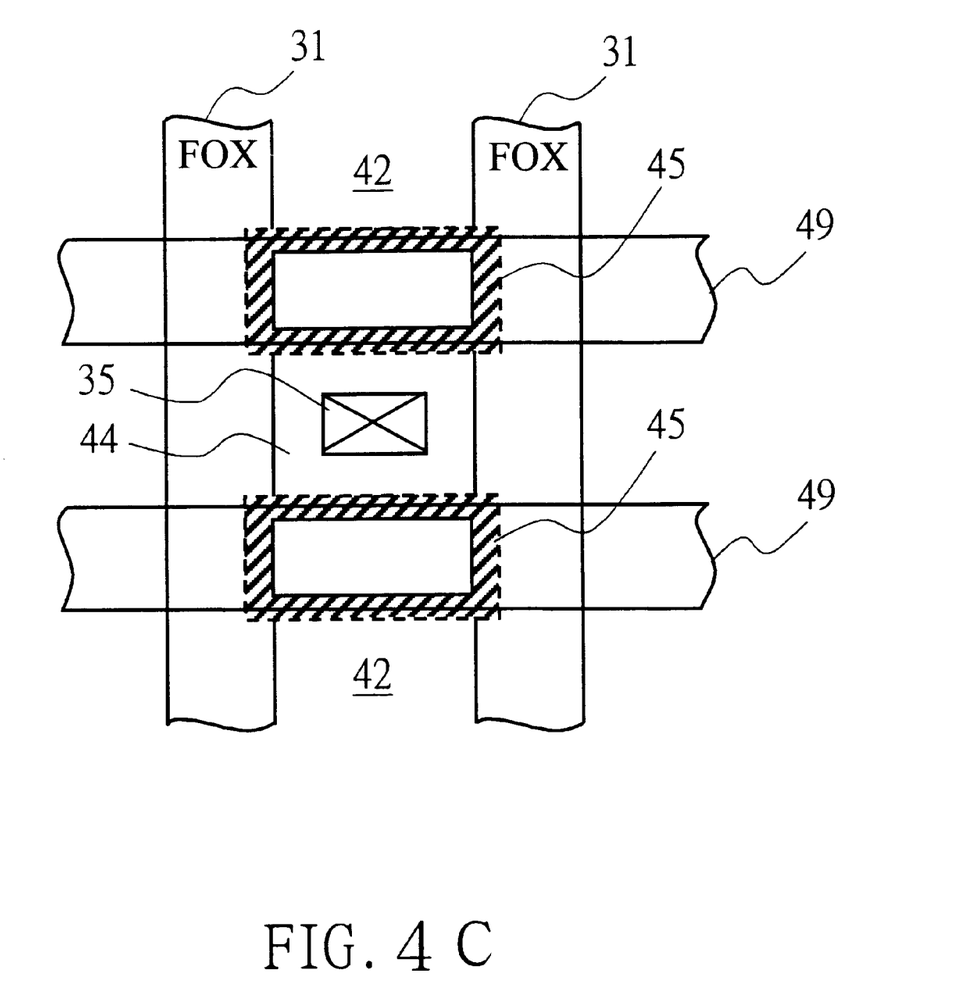

As shown in FIGS. 3A to 3H, the fabrication method of a memory cell according to a preferred embodiment of the present invention comprising the steps of:

Step A (as shown in FIG. 3A): providing a semiconductor substrate 41; forming a pad oxide 33 and a SiN 39 on the surface of the substrate 41; forming a plurality of field oxides (FOX) 31 in specific regions of the substrate 41 by the techniques of photolithography, etching, and oxidation (The action area of the memory cell can be defined between two field oxides 31.), Step B (as shown in FIGS. 3B and 4A): etching out the patterns of the pad oxide 33 and the SiN 39 to reserve only parts thereof situated between two field oxides 31 by the photolithography and etching techniques; forming a gate oxide 37 with a thickness larger than that of the tunneling oxide in prior art on the surface of the substrate 41 not covered by the SiN 39, Step C (as shown in FIG. 3C): forming a poly-silicon 45 on the surface of each region, Step D (as shown in FIGS. 3D and 4B): etching the first poly-silicon 45 to form poly-silicon spacers by the anisotropic dry etching technique so that an annular floating gate 45 circumventing the SiN 39 is formed, Step E (as shown in FIG. 3E): removing the SiN 39 and the pad oxide 33 or even the gate oxide 37 not covered by the floating gate 45; forming in turn a first oxide film 431 and a SiN film 432 of an interpoly dielectric on the floating gate 45 and the exposed surface of the substrate 41 (If the gate oxide 37 is compatible with the first oxide film 431, it is not necessary to remove the gate oxide 37), Step F (as shown in FIG. 3F): etching out the pattern of the SiN film 432; forming an injection point 455 not covered by the SiN film 432 on the top of the floating gate 45 for passing and releasing of electrons; forming a second oxide film 433 of the interpoly dielectric on the surface of each region to form the interpoly dielectric (ONO structure) composed of the first oxide film, the SiN film, and the second oxide film (If the ON structure is selected as the interpoly dielectric, this step can be omitted.), Step G (as shown in FIGS. 3G): forming a second poly-silicon 49 on the surface of the second oxide film 433; etching out the pattern of the second poly-silicon 49 to form a control gate 49 by the photolithography and etching techniques; forming a source 42 and a drain 44 at proper positions in the substrate 41 by ion implantation denoted with the dashed arrows in FIG. 3G (Because the present invention uses the capacitance coupling between the source 42 and the floating gate 45 to form a channel in the substrate under the floating gate 45, hot electrons will be injected into the floating gate 45 via this channel. The overlapping area of the source 42 and the floating gate 45 should be larger than that of the drain 44. Therefore, the junction depth of the source 42 is larger than that of the drain 44. Of course, the source 42 can be formed by ion implantation before the gate oxide 37 is formed, and a subsequent procedure of ion implantation can be proceeded to the source 42 and the drain 44 to naturally form the configuration of larger source 42 and smaller drain 44.), and Step H (as shown in FIGS. 3H and 4C): forming a metal contact window 35 or a metal layer by means of conventional techniques.

As can be seen in the above steps E and F, the interpoly dielectric is an ONO (first oxide film/SiN film/second oxide film) structure or an ON structure of good dielectric characteristic. Better dielectric characteristic and thickness control thus can be achieved. Additionally, because the floating gate 45, the interpoly dielectric 47, and the control gate 49 of the present invention are symmetric structures, there is no aligning problem, resulting in an absolute self-aligned way. Moreover, because the active areas of the control gate 49, the floating gate 45, and the source 42 are adjusted properly, the capacitance coupling ratio and the tunneling effect of electrons can be enhanced effectively. Therefore, a memory cell of a flash memory having efficient program process of writing or erase process and low leakage current can obtained.

Evidently, the source 42 and the drain 44 can be formed by ion implantation before step E. The ONO 47 and the control gate 49 are then formed. Thereby the effects and objects of the above embodiment can also be achieved.

Moreover, if applied to the fabrication process of devices of low accuracy requirement, the gate oxide 37 can be replaced with the pad oxide 33 formed in step A. It is thus not necessary to etch the pad oxide 33.

The operation conditions of a memory cell of a flash memory according to the present invention are listed in Table 1.

TABLE 1

|  | Control gate | Source | Drain | Substrate |
| --- | --- | --- | --- | --- |
| Program | $V_{cc}/2$ | $V_{pp}$ | 0.6 V | 0 V |
| Erase | $V_{pp}$ | 0 V | 0 V | 0 V |
| Read | $V_{cc}$ | 0 V | $V_{cc}/2$ | 0 V |

During the program process, the applied voltage on the control gate 49 is $V_{CG}=V_{cc}/2$ (high), while the applied voltage on the drain 44 $V_D$ is about 0.6 V. The source 42 is connected to a larger voltage $V_{pp}$ (high). The voltage of the substrate 41 is 0 V or ground. Thereby the hot electrons generated in the channel near the bottom of the floating gate 45 can be injected into the annular floating gate 45.

During the erase process, the applied voltage on the source 42, the drain 44, and the substrate 41 are $V_S=V_D=0V$, while the applied voltage on the control gate 49 is $V_{CG}=V_{pp}$ (high). Thereby the electrons existing in the control gate 45 can be moved into the control gate 49 with the help of the injection point 455.

During the read process, the voltages applied on the control gate 49 and the drain 44 are the same working voltages $V_{cc}$ or $V_{cc}/2$. In other words, $V_{CG}=V_D=V_{PP}$. The voltage applied between the source 42 and the substrate 41 is $V_S=0$ V or ground.

Summing up, the present invention relates to a memory cell structure of a flash memory and a method for fabricating the same and, more particularly, to a flash memory having annular floating gates and a method for fabricating the same. The present invention uses the capacitance coupling between the source and the floating gate to form a channel in the substrate under the floating gate. Hot electrons are injected into the floating gate or released from the floating gate to the control gate through interpoly dielectric by injection point on the top of floating gate. The present invention can not only achieve self-alignment to form the control gate and apply to high-integration memory cells with small areas, but also can release electrons from the floating gate to the control gate by the FN tunneling effect to effectively increase efficiency of erasing data and reliability of devices.

Although the present invention has been described with reference to the preferred embodiments thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

I claim:

1. A method of fabricating a memory cell of a flash memory device comprising the steps of:
   (a) establishing a substrate formed of a semicondcutor material;
   (b) forming a layered structure on a surface of said substrate, said layered structure including an SiN layer overlaying a pad oxide layer;
   (c) forming in said substrate at least a pair of field oxide portions spaced one from the other;
   (d) selectively etching said layered structure to define pad oxide portion and an SiN portion extending between said field oxide portions;
   (e) forming on said substrate about said SiN portion a gate oxide layer;
   (f) forming over said gate oxide layer a first poly-silicon layer;
   (g) selectively etching said first poly-silicon layer to define a substantially annular floating gate disposed about said SiN portion;
   (h) removing said SiN and pad oxide portions to expose a portion of said substrate surface;
   (i) forming over said floating gate and said exposed portion of said substrate surface a first oxide film;
   (j) forming over said first oxide film an SiN film;
   (k) partially removing said SiN film to define an injection point over said floating gate;
   (l) forming a second poly-silicon layer to extend over at least a portion of said SiN film and said first oxide film;
   (m) etching said second poly-silicon layer to define a control gate extending over said injection point;
   (n) forming by ion implantation in said substrate source and drain regions; and,
   (o) forming a conductive contact window coupled to said drain.

2. The method as recited in claim 1 further comprising before step (l) the step of forming a second oxide film over said SiN film and said first oxide film, said second poly-silicon layer being formed in step (l) on said second oxide film.

3. The method as recited in claim 1 wherein said control gate is formed to extend substantially over said floating gate.

4. The method as recited in claim 1 wherein said source region is formed to be greater in active area than said drain region.

5. A method of fabricating a memory cell of a flash memory device comprising the steps of:
   (a) establishing a substrate formed of a semiconductor material;
   (b) forming on a surface of said substrate a pad oxide layer;
   (c) forming to overlay said pad oxide layer an SiN layer;
   (d) forming in said substrate at least a pair of field oxide portions spaced one from the other;
   (e) selectively etching said SiN layer to define pad an SiN portion extending between said field oxide portions;
   (f) forming over said pad oxide layer about said SiN portion a first poly-silicon layer;
   (g) selectively etching said first poly-silicon layer to define a substantially annular floating gate disposed about a center region, said SiN portion being disposed in said center region;
   (h) removing said SiN portion from said center region;
   (i) forming over said floating gate and said center region a first oxide film;
   (j) forming over said first oxide film an SiN film;
   (k) partially removing said SiN film to define an injection point over said floating gate;
   (l) forming a second poly-silicon layer to extend over at least a portion of said SiN film and said first oxide film;
   (m) etching said second poly-silicon layer to define a control gate extending over said injection point;

(n) forming by ion implantation in said substrate source and drain regions; and, (o) forming a conductive contact window coupled to said drain.

6. The method as recited in claim 5, wherein step (h) includes removing said pad oxide layer disposed under said SiN portion to expose within said center region a portion of said substrate surface, said first oxide film being formed in step (i) to extend over said exposed portion of said substrate surface in said center region.

* * * * *